(12) United States Patent
Smith

(10) Patent No.: US 6,492,589 B1
(45) Date of Patent: Dec. 10, 2002

(54) ELECTRONICS ENCLOSURE UTILIZING THERMAL INSULATING CERAMIC COATING

(75) Inventor: Dwight D. Smith, Lynchburg City, VA (US)

(73) Assignee: Ericsson Inc., Research Triangle Park, NC (US)

(*) Notice: Subject to any disclaimer, the term of this patent is extended or adjusted under 35 U.S.C. 154(b) by 0 days.

(21) Appl. No.: 09/651,926

(22) Filed: Aug. 31, 2000

(51) Int. Cl.⁷ ................................................ H02G 3/08
(52) U.S. Cl. ...................... 174/50; 174/52.1; 220/3.2; 220/4.02
(58) Field of Search .................. 174/50, 52.1, 52.4, 174/58, 49, 57; 220/3.2, 3.3, 3.94, 241, 3.5, 3.6, 3.7, 3.8, 4.02, 4.01

(56) References Cited

U.S. PATENT DOCUMENTS

| | | | | |
|---|---|---|---|---|
| 3,699,394 A | * | 10/1972 | Schuler | 174/52.2 |
| 4,295,179 A | * | 10/1981 | Read | 361/331 |
| 4,726,412 A | | 2/1988 | Magnan et al. | |
| 4,997,698 A | * | 3/1991 | Oboodi et al. | 427/287 |
| 5,041,695 A | * | 8/1991 | Olenick et al. | 174/52.4 |
| 5,621,189 A | * | 4/1997 | Dodds | 174/50 |
| 5,641,941 A | * | 6/1997 | Dieman, Jr. et al. | 174/52.1 |
| 5,652,648 A | * | 7/1997 | Behe et al. | 399/164 |
| 5,864,091 A | * | 1/1999 | Sumida | 174/50 |
| 5,910,642 A | * | 6/1999 | Daoud | 174/57 |
| 5,917,393 A | * | 6/1999 | Kupiszewski et al. | 174/125.1 |
| 5,981,871 A | * | 11/1999 | Trumble et al. | 174/51 |
| 6,002,584 A | | 12/1999 | Messmer et al. | |
| 6,130,381 A | * | 10/2000 | Keith et al. | 174/53 |
| 6,219,258 B1 | * | 4/2001 | Denzene et al. | 174/35 MS |
| 6,238,743 B1 | * | 5/2001 | Brooks | 134/2 |
| 6,300,564 B1 | * | 10/2001 | Moraes et al. | 174/52.1 |
| 6,323,418 B1 | * | 11/2001 | Tiburtius et al. | 174/35 GC |
| 6,326,543 B1 | * | 12/2001 | Lamp et al. | 174/50 |

FOREIGN PATENT DOCUMENTS

| | | |
|---|---|---|
| DE | 4337924 | 5/1995 |
| DE | 19734584 | 2/1999 |
| EP | 0984073 | 4/2000 |

* cited by examiner

Primary Examiner—Dean A. Reichard
Assistant Examiner—Angel R. Estrada
(74) Attorney, Agent, or Firm—Coats & Bennett, P.L.L.C.

(57) ABSTRACT

An electronics enclosure (10) utilizing thermal insulating ceramic coating (50) includes a first member (14) having a first surface (26), and a second member (16) having a second surface (28). The first and second members (14, 16) are movable relative to each other between an enclosing position wherein a plurality of electronic components (12) are enclosed within an interior chamber (19) of the electronics enclosure (10), and an open position wherein the plurality of electronic components (12) are accessible for servicing. With the first and second members (14, 16) in the enclosing position, the first and second surfaces (26, 28) face and extend around the interior chamber (19). The first and second members (14, 16) have third and fourth surfaces (32, 34), respectively, facing oppositely from the first and second surfaces (26, 28) and defining the exterior of the first and second members (14, 16), respectively. The electronics enclosure (10) further includes a thermal insulating coating (50) adhered to and covering a majority of at least one of the first, second, third, and fourth surfaces (26, 28, 32 and 34). The ceramic coating (50) has a thickness of about 0.005 " or greater, and includes ceramic particles suspended in a binder.

30 Claims, 2 Drawing Sheets

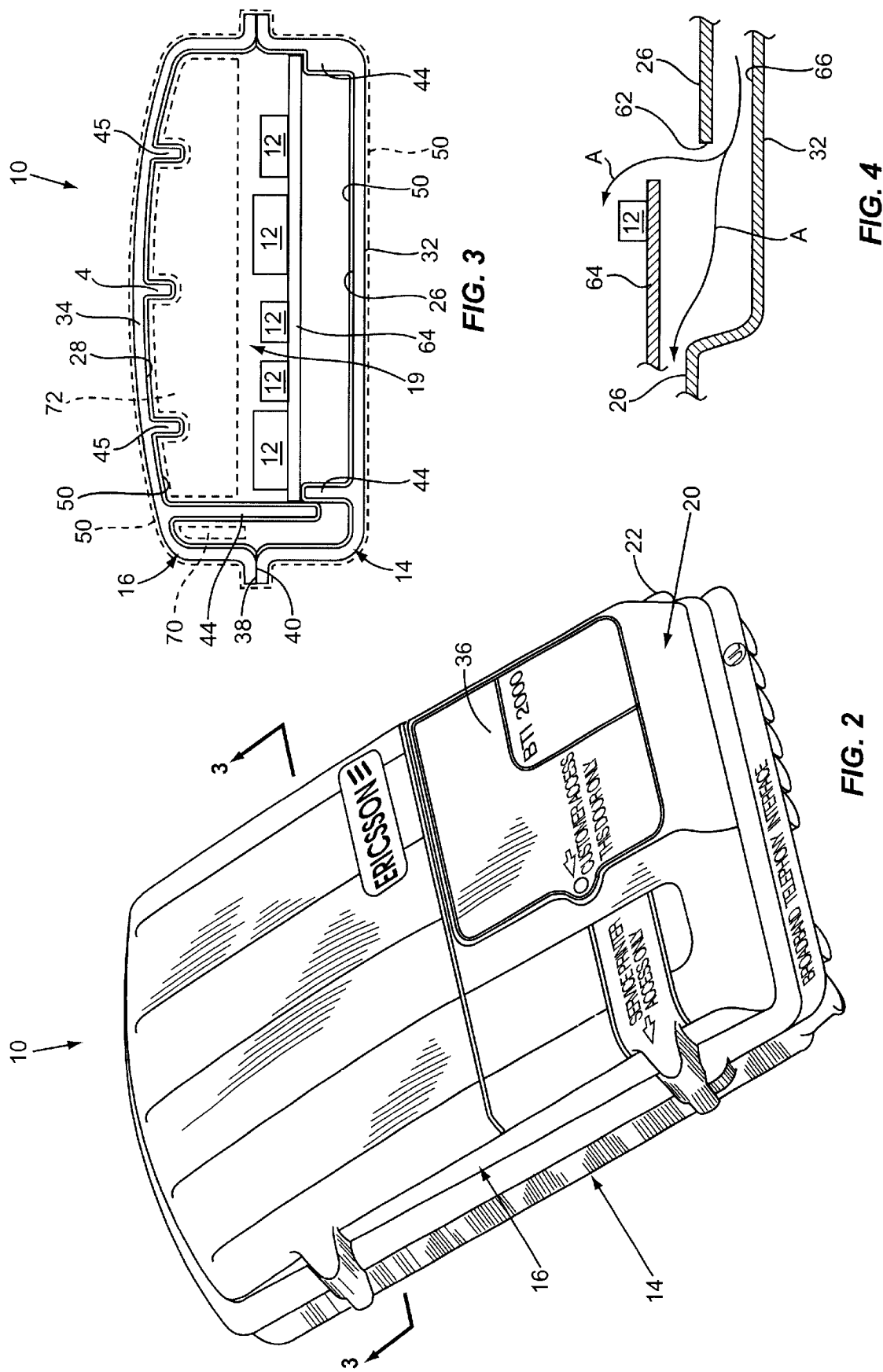

ELECTRONICS ENCLOSURE UTILIZING THERMAL INSULATING CERAMIC COATING

BACKGROUND OF THE INVENTION

This invention relates to electronics enclosures that are subject to heating from the surrounding environment, such as electronics enclosures that are mounted outdoors and/or exposed to direct sunlight. One problem associated with such enclosures is maintaining the electronics contained within the electronics enclosure at or below a maximum desired operating temperature. This problem has two components; first, the heat input into the electronics enclosure from the surrounding environment, and second, the heat generated by the electronics contained within the electronics enclosure.

With respect to the first component, in some environments, one of the most significant heat loads on an electronic enclosure is the radiant heat load. For example, for many outdoor electronic enclosures, the radiant heat load generated by direct sunlight, often referred to as the solar load, can be quite significant. Conventionally, radiant or solar heat loading has been handled in three ways.

(1) choosing a material for the exterior of the enclosure that is as reflective as possible to the radiant or solar load, (2) using one or more heat shields to shade the enclosure from direct radiant heating, such as direct sunlight, and (3) providing a fan for forced air convection cooling of the enclosure.

While each of the above approaches may perform satisfactorily, there is always room for improvement. For example, for some applications, highly reflective materials may not be optimum in terms of the aesthetic appearance of the enclosure, the manufacturing cost of the enclosure, and/or the durability of the enclosure. By way of further example, the use of one or more heat shields can limit flexibility in the aesthetic design of an enclosure, complicate the installation of the electronics enclosure, increase the manufacturing cost and/or limit the amount of cooling air flow over and/or into the enclosure. As yet another example, the use of a cooling fan requires a motor drive and a power supply, which can increase the cost, complexity, size, failure modes, and installation time of the electronics enclosure.

SUMMARY OF THE INVENTION

In accordance with one form of the invention, an electronics enclosure includes a first member having a first surface, and a second member having a second surface. The first and second members are movable relative to each other between an enclosing position wherein at least one electronic component is enclosed within an interior chamber of the electronics enclosure and an open position wherein at least one electronic component within the electronics enclosure is accessible for servicing. With the first and second members in the enclosing position, the first and second surfaces face and extend around the interior chamber. The first and second members have third and fourth surfaces, respectively, facing oppositely from the first and second surfaces and defining the exterior of the first and second members, respectively. The electronics enclosure further includes a thermal insulating ceramic coating adhered to and covering a majority of at least one of the first, second, third, and fourth surfaces. The ceramic coating has a thickness on the order of 0.005" or greater, and includes ceramic particles suspended in a binder.

In one form, at least one of the first and second members is a plastic member, and is preferably a molded plastic member.

In one form, both of the first and second members are plastic members.

In one form, the binder is an acrylic resin.

In one form, the thermal insulating ceramic coating adheres to and covers a majority of the first and second surfaces.

In one form, the thermal insulating ceramic coating adheres to and covers a majority of the third and fourth surfaces.

In one form, the thermal insulating ceramic coating adheres to and covers a majority of the first and second surfaces, and the third and fourth surfaces are not coated with a thermal insulating ceramic coating.

BRIEF DESCRIPTION OF THE DRAWINGS

FIG. 2 is a perspective view showing the electronics enclosure in an enclosing position;

FIG. 3 is a diagrammatic section view of the electronics enclosure taken generally along the line 3—3 in FIG. 2; and FIG. 4 is an enlarged, partial section view taken generally along the line 4—4 in FIG. 1.

DETAILED DESCRIPTION OF THE PREFERRED EMBODIMENTS

Figure 1:
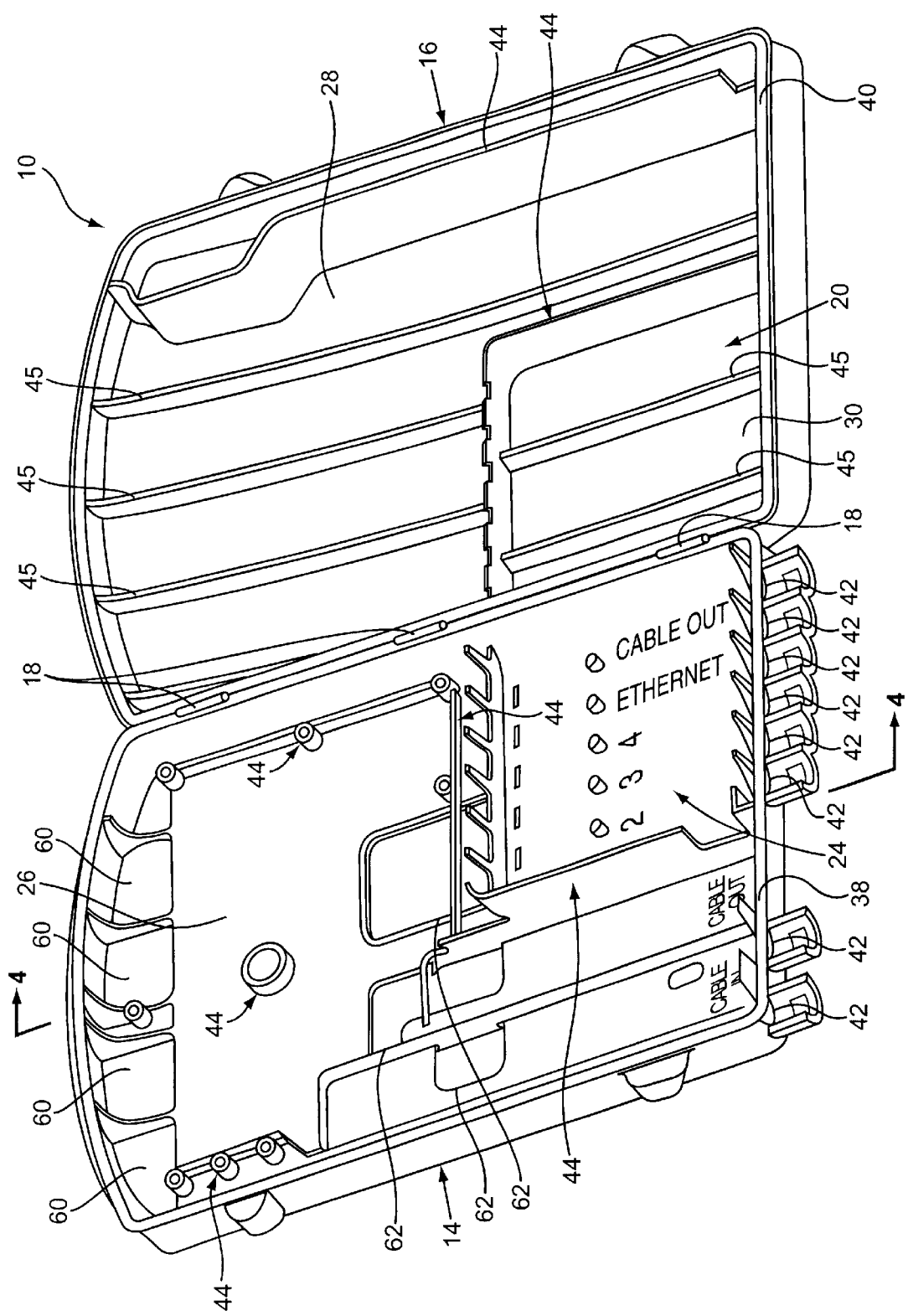
FIG. 1 is a perspective view showing an electronics enclosure embodying the present invention in an open position.

With reference to FIG. 1, for purposes of illustration, a preferred form of the invention is embodied in an electronics enclosure 10 for a broadband telephony interface (BTI). The electronics enclosure 10 is used to mount and enclose a plurality of electronic components, shown schematically at 12 in FIG. 3 in the form of a voice over Internet Protocol (VOIP) cable modem and the interface connections associated therewith (not shown in FIGS. 1 and 2). However, it should be understood that the invention will be useful in electronics enclosures other than for a broadband telephony interface and accordingly, no limitation to use with a broadband telephony interface, VOIP cable modem, or with any other particular types or number of electronic component is intended.

As best seen in FIG. 1, the electronics enclosure 10 includes a member 14 in the form of a cabinet or base, and a member 16 in the form of a door or cover for the member 14. In the illustrated embodiment, the member 16 is joined to the member 14 at hinge connections 18. As seen in FIGS. 1 and 2, the members 14 and 16 are guidingly movable relative to each other between an enclosing position, shown in FIGS. 2 and 3, wherein the plurality of electronic components 12 are enclosed within an interior chamber 19 of the electronics enclosure 10 and an open position, shown in FIG. 1, wherein the plurality of electronic components 12 can be installed and/or are accessible for servicing.

The member 16 includes a submember 20 that is joined to the member 16 at hinge connections 22 (only one of three shown in FIG. 2), to be movable guidingly relative to the members 14 and 16 between an enclosing position shown in FIG. 2 wherein one or more of the plurality of electronic components 12 are enclosed within a subchamber 24 of the interior chamber 19 and open position (not shown) wherein one or more of the plurality of electronic components 12 in the subchamber 24 can be installed and/or are accessible for servicing. More specifically, in this embodiment the subchamber 24 receives and supports connections for four telephone lines, an ethernet cable, and a cable TV coax, none of which is shown because the invention herein is not directed to these, or any specific type of, electrical connections or components. The submember 20 allows for these connections to be accessed without moving the member 16 to the open position to allow access to the remaining electronic components in the enclosure 10. This is a desirable feature for a service provider that wants to limit access by a customer or subscriber to only certain of the components 12 in the electronic enclosure 10.

The members 14, 16, and 20 have respective surfaces 26, 28, and 30 that face and extend around the interior chamber 19, including the subchamber 24, with the electronics enclosure 10 in the enclosing position. The members 14, 16, and 20 further include respective surfaces 32, 34, and 36 that face oppositely from the respective surfaces 26, 28, and 30 and define the exterior of the members 14, 16, and 20. The members 12 and 14 further include respective interface surfaces 38 and 40 that abut each other in the enclosing position and define respective perimeters for the surfaces 26 and 28.

The member 14 defines a number of ports or openings 42 for the various electrical conductors (not shown) that are connected to the electronic components 12 mounted in the enclosure 10. Various mount, support, and shielding structures 44 for the electronic components 12 are provided in the chamber 19. For example, the illustrated embodiment includes, moving from left to right in FIG. 1, a port 42 for a power cable, a port 42 for a hybrid fiber coax, four ports 42 for four telephone lines, a port 42 for an ethernet cable, and a port 42 for a cable TV coax. Because the openings 42 and the structures 44 will vary significantly from application to application depending upon the requirements of the particular electronic components intended for the electronics enclosure 10, further description of the features 42 and 44 will not be provided for the sake of brevity.

Preferably, the members 14, 16, and 20 and their various features 26–44 are molded from a suitable plastic material that will provide adequate structural and electrical properties for the intended application. In the illustrated embodiment, the members 14, 16, and 20 are molded from a PVC (Poly Vinyl Chloride)/ABS blend such as the material commercially identified as VISTA 9422 grey SL#90145 and manufactured by Condea Vista, Co. With respect to the structural integrity, the surfaces 28 and 30 include a number of stiffening ribs 45, which may not be required in all applications. In the illustrated embodiment, the structures 44 are molded into the respective surfaces 26 and 28 of the members 14 and 16.

While it is preferred that the members 14, 16, and 20 be molded plastic, it may be advantageous in some applications for other materials to be used for the electronics enclosure 10, such as, for example, metal or composite materials.

As best seen in FIG. 3, the electronics enclosure 10 further includes a thermal insulating ceramic coating 50 adhered to and covering the majority of, and preferably substantially all of, at least one of the surfaces 26–36. In one preferred embodiment, the thermal insulating ceramic coating 50 adheres to and covers the majority of the surfaces 26–30. This provides thermal insulation for the electronics enclosure 10, while protecting the coating 50 from the environment surrounding the enclosure 10. Further, if the surfaces 32–36 are free of the ceramic coating 50, the coating 50 on the interior surfaces 26–30 provides thermal insulation while allowing the exterior of the members 14, 16, and 20 defined by the surfaces 32–36 to be made aesthetically pleasing by conventional forming of the particular material selected for the members 14, 16, and 20, which in a preferred embodiment is molded plastic. In one embodiment of the enclosure 10, the thermal insulating ceramic coating 50 is adhered to and covers a majority of, and preferably substantially all of, the surfaces 32–36, as shown by the phantom lines in FIG. 3. This provides superior thermal insulation in comparison to the application of an equal thickness of the thermal insulating ceramic coating 50 on the surfaces 26–30, and allows for the exterior to have a "painted" appearance using any of a number of colors for the electronics enclosure 10 selected by using suitable pigments in the ceramic coating 50. In one embodiment, the coating 50 is adhered to and covers a majority of, and preferably substantially all of, the surfaces 26–36, and may also adhere to and cover the interface surfaces 38 and 40.

The ceramic coating 50 includes ceramic particles suspended in a binder. While any suitable thermally insulating ceramic coating 50 may be used, it is preferred that the binder be an acrylic resin and that the coating 50 have a water soluble base when applied to the enclosure 10. Two suitable, commercially available ceramic coatings 50 are identified commercially as INCA CH201 and INCA S2100 from Insulating Coatings of America, 2854 E. Ponce de Leon Avenue, Decatur, Ga. 30030, phone 1-800-234-5001 and 404-378-5147. It is preferred that the ceramic coating 50 be sprayed on and air cured. However, any suitable method of application may be used, such as, for example, brush application, roller application, or dip application. Additionally, for some ceramic coatings 50, the curing process can be accelerated through the use of increased curing temperatures in an oven. While the optimum thickness of the thermally insulating ceramic coating will vary depending upon the requirements of any particular application, such as the worst case anticipated environmentally generated heat loads, the heat load generated by the electronic components intended for the application, and the amount of free convection cooling available are anticipated for the particular application, it is preferred that the thickness be on the order of at least 0.005" or greater, and, in a highly preferred embodiment using either of the INCA CH201 or INCA S2100 coatings 50, it is preferred that the thickness be in the range of 0.005" to 0.030". In this regard, it should be understood that the thicknesses of the coating 50 shown in FIG. 3 are somewhat exaggerated for purposes of illustration.

In the illustrated embodiment, the member 14 includes a number of convection air openings or passages 60 and 62 that direct a free convection air flow through the chamber 19 over at least some of the heat generating electronic components 12 in the chamber 19. In this regard, as seen in FIG. 4, the passages 62 direct the free convection air flow on both sides of a printed circuit board 64 containing the cable modem. Further, the passages 62 each include a duct 66 that extends towards the bottom of the enclosure 10 to draw air from the bottom area of the exterior of the enclosure 10, thereby reducing the recirculation of the heated convection air flow exiting the passages 62 at the top of the enclosure 10.

Depending on the heat loads and available free convection air flow for a particular application, the enclosure 10 may also include one or more supplementary insulating members. For example, the enclosure 10 may optionally include one or more polystyrene inserts, such as the inserts 70 and 72 shown by phantom lines in FIG. 3, that are shaped to overlie and substantially cover the surface 28. For the illustrated embodiment, a polystyrene insert (not shown) can also be provided that is shaped to overlie and substantially cover the surface 30. In this regard, grooves may be provided in the polystyrene inserts to accommodate the strengthening ribs 41, or the ribs 41 may be allowed to press into the polystyrene material when the insert is installed against the surface 28. This is also true for a polystyrene insert that would overlay the surface 30. The optimum thickness of the polystyrene inserts will very greatly depending upon the requirements of each particular application.

While a highly preferred embodiment of an electronics enclosure 10 has been illustrated and described herein, it should be understood that an electronics enclosure 10 embodying the present invention can be provided in many other forms. For example, while it is preferred that the members 14, 16, and 20 be made of molded plastic, other materials can be used. As another example, while the members 14 and 16 are shown as directly engaging each other at the surfaces 38 and 40 in the enclosing position, an intermediate member, such as a seal or a spacer, may be interposed between the members 14 and 16. As yet another example, while the member 16 is shown as being hinged to the member 14, and the member 20 is shown as being hinged to the member 16, any suitable type of connections, such as bolt flange, screw bosses, tab fasteners, mating flanges and channels, clamps, brackets, etc., may be used to connect the members 14, 16, and 20 together in the enclosing position. As a further example, while the member 16 is shown as including the member 20 for access to the subchamber 24, it may be advantageous in many applications to eliminate the member 20 so that the member 16 has a one piece construction.

What is claimed is:

1. An electronics enclosure comprising:
   a first member having a first surface;
   a second member having a second surface, the first and second members movable relative to each other between an enclosing position wherein at least one electronic component is enclosed within the electronics enclosure and an open position wherein at least one electronic component within the electronics enclosure is accessible for servicing, the first and second surfaces facing and extending around an interior chamber configured to receive at least one electronic component with the first and second members in the enclosing position, the first and second members having third and fourth surfaces, respectively, facing oppositely from the first and second surfaces and defining the exterior of the first and second members, respectively; and
   a thermal insulating ceramic coating adhered to and covering a majority of at least one of the first, second, third, and fourth surfaces, the ceramic coating having a thickness of on the order of 0.005 inch or greater, the ceramic coating comprising ceramic particles suspended in a binder.

2. The electronics enclosure of claim 1 wherein at least one of the first and second members is a molded plastic member.

3. The electronics enclosure of claim 1 wherein the binder is an acrylic resin.

4. The electronics enclosure of claim 1 wherein the thermal insulating ceramic coating adheres to and covers a majority of the first and second surfaces.

5. The electronics enclosure of claim 4 wherein the third and fourth surfaces are not coated with the thermal insulating ceramic coating.

6. The electronics enclosure of claim 4 wherein the thermal insulating ceramic coating adheres to and covers a majority of the third and fourth surfaces.

7. The electronics enclosure of claim 1 wherein the thermal insulating ceramic coating adheres to and covers a majority of the third and fourth surfaces.

8. The electronics enclosure of claim 7 wherein the first and second surfaces are not coated with the thermal insulating ceramic coating.

9. The electronics enclosure of claim 1 further comprising a layer of expanded polystyrene insulation overlying a majority of the at least one of the first, second, third, and fourth surfaces.

10. The electronics enclosure of claim 1 further comprising at least one electronic component within the interior chamber.

11. In combination:
    at least one electronic component; and
    an electronics enclosure comprising:
       a first member having a first surface;
       a second member having a second surface, the first and second members movable relative to each other between an enclosing position wherein the at least one electronic component is enclosed within the electronics enclosure and an open position wherein the at least one electronic component is accessible for servicing, the first and second surfaces facing and extending around an interior chamber configured to receive the at least one electronic component with the first and second members in the enclosing position, the first and second members having third and fourth surfaces, respectively, facing oppositely from the first and second surfaces and defining the exterior of the first and second members, respectively; and
       a thermal insulating ceramic coating adhered to and covering a majority of at least one of the first, second, third, and fourth surfaces, the ceramic coating having a thickness on the order of 0.005 inch or greater, the ceramic coating comprising ceramic particles suspended in a binder.

12. The combination of claim 11 wherein at least one of the first and second members is a molded plastic member.

13. The electronics enclosure of claim 11 wherein the binder is an acrylic resin.

14. The combination of claim 11 wherein the thermal insulating ceramic coating adheres to and covers a majority of the first and second surfaces.

15. The combination of claim 14 wherein the third and fourth surfaces are not coated with the thermal insulating ceramic coating.

16. The combination enclosure of claim 14 wherein the thermal insulating ceramic coating adheres to and covers a majority of the third and fourth surfaces.

17. The combination of claim 11 wherein the thermal insulating ceramic coating adheres to and covers a majority of the third and fourth surfaces.

18. The combination of claim 17 wherein the first and second surfaces are not coated with the thermal insulating ceramic coating.

19. The combination of claim 11 further comprising a layer of expanded polystyrene insulation overlying a majority of the at least one of the first, second, third, and fourth surfaces.

20. An electronics enclosure comprising:
    a first molded plastic member having a first surface;
    a second molded plastic member having a second surface, the first and second molded plastic members movable relative to each other between an enclosing position where a plurality of electronic components are enclosed within the electronics enclosure and an open position where a plurality of electronic components are accessible for servicing, the first and second surfaces facing and extending around an interior chamber configured to receive a plurality of electronic components with the first and second molded plastic members in the enclosing position, the first and second molded plastic members having third and fourth surfaces, respectively, facing oppositely from the first and second surfaces and defining the exterior of the first and second plastic members, respectively; and a thermal insulating ceramic coating adhered to and covering a majority of at least one of the first, second, third, and fourth surfaces, the ceramic coating having a thickness of about 0.005 inch or greater, the ceramic coating comprising ceramic particles suspended in a binder.

21. The electronics enclosure of claim 20 wherein the binder is an acrylic resin.

22. The electronics enclosure of claim 20 wherein the thermal insulating ceramic coating adheres to and covers a majority of the first and second surfaces.

23. The electronics enclosure of claim 22 wherein the third and fourth surfaces are not coated with the thermal insulating ceramic coating.

24. The electronics enclosure of claim 22 wherein the thermal insulating ceramic coating adheres to and covers a majority of the third and fourth surfaces.

25. The electronics enclosure of claim 20 wherein the thermal insulating ceramic coating adheres to and covers a majority of the third and fourth surfaces.

26. The electronics enclosure of claim 25 wherein the first and second surfaces are not coated with the thermal insulating ceramic coating.

27. The electronics enclosure of claim 20 further comprising a layer of expanded polystyrene insulation overlying a majority of the at least one of the first, second, third, and fourth surfaces.

28. A method of protecting an electronics component, said method comprising:

forming a chamber with at least one member having an interior and an exterior surface;

placing an electronic component with the chamber; and applying a thermal insulating ceramic coating on at least one of the interior and exterior surfaces of the at least one member to reduce the rate of heat transmission through the at least one member into the chamber.

29. An electronics enclosure comprising:

a housing for containing an electronic component, the housing including an exterior surface; and a thermal insulating ceramic coating adhered to and covering at least a majority of the exterior surface of the housing.

30. The electronics enclosure of claim 29, the housing further including an interior surface and wherein the thermal insulating ceramic coating adheres and covers at least a majority of the interior surface.

* * * * *